United States Patent
Kim et al.

(10) Patent No.: US 10,297,777 B2
(45) Date of Patent: May 21, 2019

(54) ORGANIC LIGHT-EMITTING DEVICE HAVING MULTI-LAYERED ELECTRON BLOCKING LAYER AND P-DOPED LAYER

(71) Applicants: SAMSUNG ELECTRONICS CO., LTD., Suwon-si, Gyeonggi-do (KR); Samsung SDI Co., Ltd., Yongin-si, Gyeonggi-do (KR)

(72) Inventors: Jongsoo Kim, Suwon-si (KR); Hosuk Kang, Suwon-si (KR); Sunghan Kim, Seongnam-si (KR); Joonghyuk Kim, Seoul (KR); Youngmok Son, Hwaseong-si (KR); Myungsun Sim, Suwon-si (KR); Namheon Lee, Suwon-si (KR); Sooghang Ihn, Hwaseong-si (KR)

(73) Assignee: SAMSUNG ELECTRONICS CO., LTD., Gyeonggi-DO (KR)

( * ) Notice: Subject to any disclaimer, the term of this patent is extended or adjusted under 35 U.S.C. 154(b) by 28 days.

(21) Appl. No.: 15/674,550

(22) Filed: Aug. 11, 2017

(65) Prior Publication Data

US 2018/0047925 A1    Feb. 15, 2018

(30) Foreign Application Priority Data

Aug. 11, 2016    (KR) .......................... 10-2016-0102441

(51) Int. Cl.
    *H01L 51/50*    (2006.01)
(52) U.S. Cl.
    CPC ...... *H01L 51/5004* (2013.01); *H01L 51/5012* (2013.01); *H01L 51/5056* (2013.01);
    (Continued)

(58) Field of Classification Search
    None
    See application file for complete search history.

(56) References Cited

U.S. PATENT DOCUMENTS

| | | | |
|---|---|---|---|
| 2008/0035965 A1* | 2/2008 | Hayashi | ............ H01L 27/14647 |
| | | | 257/291 |
| 2011/0194000 A1 | 8/2011 | Suzuki et al. | |

(Continued)

FOREIGN PATENT DOCUMENTS

| | | |
|---|---|---|
| KR | 1020060061797 A | 6/2006 |
| KR | 1020130129683 A | 11/2013 |
| KR | 1020150026833 A | 3/2015 |

OTHER PUBLICATIONS

Huishan Yang, et al., "Organic light-emitting devices with double-block layer", Microelectronics Journal, 37 (2006) 1271-1275.

(Continued)

*Primary Examiner* — Michelle Mandala
(74) *Attorney, Agent, or Firm* — Cantor Colburn LLP

(57) ABSTRACT

An organic light-emitting device includes a first electrode layer; a hole injection layer on the first electrode layer; a hole transport layer on the hole injection layer; an electron blocking layer on the hole transport layer, and including a plurality of layers; a light-emitting layer on the electron blocking layer; an electron transport layer on the light-emitting layer; an electron injection layer on the electron transport layer; and a second electrode layer on the electron transport layer, wherein the electron blocking layer has a highest occupied molecular orbital value which is lower than a highest occupied molecular orbital value of the hole transport layer, and the light-emitting layer has a HOMO value which is lower than a highest occupied molecular orbital value of the electron blocking layer.

17 Claims, 5 Drawing Sheets

(52) U.S. Cl.
CPC .... *H01L 51/5096* (2013.01); *H01L 2251/552* (2013.01); *H01L 2251/558* (2013.01)

(56) References Cited

U.S. PATENT DOCUMENTS

2014/0072839 A1   3/2014   Park et al.
2015/0001499 A1*  1/2015   Kim .................. H01L 51/504
                                                  257/40
2015/0162493 A1   6/2015   Ahn

OTHER PUBLICATIONS

Lihua Zhu, et al., "Metallophthalocyanine films as hole-transport layer in organic light-emitting devices", Synthetic Metals, 126 (2002) 331-335.

* cited by examiner

ORGANIC LIGHT-EMITTING DEVICE HAVING MULTI-LAYERED ELECTRON BLOCKING LAYER AND P-DOPED LAYER

CROSS-REFERENCE TO RELATED APPLICATION

This application claims priority to and the benefit of Korean Patent Application No. 10-2016-0102441, filed on Aug. 11, 2016, in the Korean Intellectual Property Office, and all the benefits accruing therefrom under 35 U.S.C. § 119, the content of which is incorporated herein by reference in its entirety.

BACKGROUND

1. Field

The present disclosure relates to an organic light-emitting device, and more particularly, to an organic light-emitting device including a multi-layered electron blocking layer between a hole transport layer and a light-emitting layer, and a P-doped layer.

2. Description of the Related Art

Organic light-emitting devices, which are emissive type devices, have advantageous features, such as wide viewing angle, high contrast ratio, short response time, high brightness, low driving voltage, and multi-color display.

An organic light-emitting device has a structure in which an anode electrode is formed above a substrate, and a hole injection layer (HIL), a hole transport layer (HTL), a light-emitting layer, an electron transport layer (ETL), an electron injection layer (EIL), and a cathode electrode are sequentially formed on the anode electrode. The HTL, the light-emitting layer, and the ETL are organic thin film layers generally formed of an organic compound.

The principle of operating an organic light-emitting device is as follows. When a voltage is applied between an anode electrode and a cathode electrode, holes injected from the anode electrode move to the light-emitting layer through the HTL, and electrons injected from the cathode electrode move to the light-emitting layer through the ETL. The holes and electrons (carriers), having moved to the light-emitting layer, recombine in the light-emitting layer and generate excitons, and light is generated when an energy level of the excitons changes from an excited state to a base state.

SUMMARY

Provided are organic light-emitting devices having a cascade structure in which highest occupied molecular orbital (HOMO) values of an HTL, an electron blocking layer, and a light-emitting layer are gradually lowered by a multi-layered electron blocking layer between the HTL and the light-emitting layer.

Provided are organic light-emitting devices in which excitons and electrons moving into an electron blocking layer and an HTL are effectively controlled by inserting a P-doped layer in a multi-layered electron blocking layer.

Provided are organic light-emitting devices configured to have optimized efficiency and lifetime performance by changing the location of a P-doped layer inserted in the multi-layered electron blocking layer.

According to an aspect of an embodiment, an organic light-emitting device includes: a first electrode layer; a hole injection layer on the first electrode layer; a hole transport layer on the hole injection layer; an electron blocking layer on the HTL, and including a plurality of layers; a light-emitting layer on the electron blocking layer; an electron transport layer on the light-emitting layer; an electron injection layer on the electron transport layer; and a second electrode layer on the electron transport layer, wherein the electron blocking layer has a highest occupied molecular orbital value which is lower than a highest occupied molecular orbital value of the hole transport layer, and the light-emitting layer has a highest occupied molecular orbital value which is lower than a highest occupied molecular orbital value of the electron blocking layer.

The electron blocking layer including the plurality of layers may include a first electron blocking layer on the hole transport layer and a second electron blocking layer on the first electron blocking layer, wherein the second electron blocking layer has a highest occupied molecular orbital value which is lower than a highest occupied molecular orbital value of the first electron blocking layer.

The organic light-emitting device may further include a P-doped layer between the hole transport layer and the first electron blocking layer.

The electron blocking layer may have a thickness in a range from about 25 angstroms (Å) to about 300 Å.

The P-doped layer may have a thickness of less than 25% of a thickness of the electron blocking layer.

The P-doped layer may have a thickness in a range from about 5 Å to about 75 Å.

The organic light-emitting device may further include a P-doped layer inserted in the electron blocking layer.

The electron blocking layer may have a thickness in a range from about 25 Å to about 300 Å.

The P-doped layer may have a thickness of less than 25% of a thickness of the electron blocking layer.

The P-doped layer may have a thickness in a range from about 5 Å to about 75 Å.

The P-doped layer may include a first surface on a side of the light-emitting layer and a second surface on a side of the hole transport layer, wherein a distance from the light-emitting layer to the first surface is less than a thickness of the electron blocking layer.

The P-doped layer may be in contact with the light-emitting layer.

The P-doped layer may have a thickness which is greater than 25% of a thickness of the electron blocking layer and less than 100% of the thickness of the electron blocking layer.

The P-doped layer may be in contact with the hole transport layer.

According to an aspect of an embodiment, an organic light-emitting device includes: a first electrode layer; a hole injection layer on the first electrode layer; a multilayer electron blocking layer on the hole transport layer; a light-emitting layer on the electron blocking layer; an electron transport layer on the light-emitting layer; an electron injection layer on the electron transport layer; and a second electrode layer on the electron transport layer, wherein the multilayer electron blocking layer comprises a first electron blocking layer, a second electron blocking layer, and a P-doped layer, wherein the P-doped layer is inserted in the first electron blocking layer, the second electron blocking layer, or in a combination of the first electron blocking layer and the second electron blocking layer.

Additional aspects will be set forth in part in the description which follows and, in part, will be apparent from the description, or may be learned by practice of the presented embodiments.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
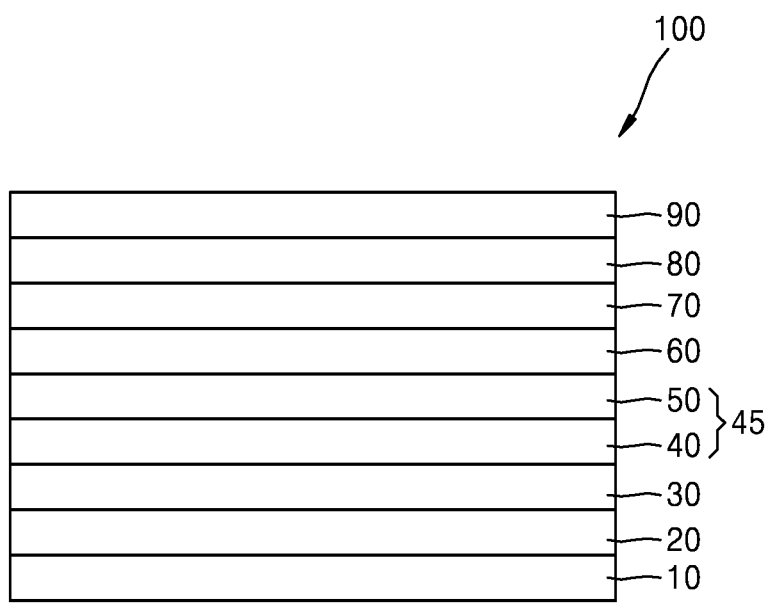
FIG. 1 is a cross-sectional view of an organic light-emitting device according to an embodiment.

Reference will now be made in detail to the following embodiments, examples of which are illustrated in the accompanying drawings so that those of ordinary skill in the art may readily understand the inventive concept. The embodiments may, however, be embodied in many different forms and should not construed as being limited to the descriptions set forth herein. In the drawings, portions irrelevant to the description are omitted for convenience of explanation. Like numerals refer to like elements throughout the description of the figures.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the term "and/or" includes any and all combinations of one or more of the associated listed items. "Or" means "and/or." As used herein, the singular forms "a," "an," and "the" are intended to include the plural forms, including "at least one," unless the content clearly indicates otherwise. "At least one" is not to be construed as limiting "a" or "an." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the description of the various embodiments, it will be understood that, when an element is referred to as being "connected to" another element, it means the element is electrically connected to the other element when the element is directly connected to the other element and when the element is indirectly connected to the other element by an intervening constituent element.

The term "p-doped" as used herein, refers to a structure or layer that is doped with a p-type dopant. The term "P-type dopant" as used herein, refers to a doping agent. The P-type dopant may include an organic compound, an inorganic compound, an organometallic compound, or a combination thereof. The organic compound may include tetracyanoquinodimethane (TCNQ),2,3,5, 6-tetrafluoro-7,7,8,8-tetracyanoquinodimethane (F$_4$-TCNQ), or pyrazino[2,3-f][1,10] phenanthroline-2,3-carbonitrile (PPDN), but is not limited thereto, The inorganic compound may include a metal oxide such as WO$_3$ or MoO$_3$, but is not limited thereto, A combination comprising at least one of the foregoing may also be used FIG. 1 is a cross-sectional view of an organic light-emitting device 100, according to an embodiment.

Referring to FIG. 1, the organic light-emitting device 100 includes a first electrode layer 10, a hole injection layer (HIL) 20, a hole transport layer (HTL) 30, an electron blocking layer 45, a light-emitting layer 60, an electron transport layer (ETL) 70, an electron injection layer (EIL) 80, and a second electrode layer 90.

The first electrode layer 10 may be an anode electrode, and may be configured to supply holes to the HIL 20. In detail, the first electrode layer 10 may supply holes to the HIL 20 by receiving an electrical signal from a thin film transistor (TFT) (not shown) connected to the first electrode layer 10.

The first electrode layer 10 may include a material having a low work function so as to supply holes to the HIL 20. In an embodiment, the first electrode layer 10 may include a material having a low work function and a conductive oxide. The conductive oxide may include a transparent material, for example, indium tin oxide (ITO), indium zinc oxide (IZO), and indium tin zinc oxide (ITZO). A combination comprising at least one of the foregoing may be used.

The HIL 20 may be formed on the first electrode layer 10. The HIL 20 may transmit holes received from the first electrode layer 10 to the HTL 30. The HIL 30 may include arylamine based compounds such as 4,4',4"-tris(N,N-diphenylamino)triphenylamine NATA), 4,4'4"-tris(N-(1-naphthyl)-N-phenylamino)triphenylamine (1T-NATA), 4,4',4"-tris[2-naphthyl(phenyl)amino] triphenylamine (2T-NATA), and NPNPB, or p-dopant compounds such as tetracyanoquinodimethane (TCNQ), 2,3,5,6-tetrafluoro-7,7,8,8-tetracyanoquinodimethane ($F_4$-TCNQ), and pyrazino[2,3-f][1,10]phenanthroline-2,3-carbonitrile (PPDN), but is not limited thereto. A combination comprising at least one of the foregoing may also be used.

The HTL 30 may be formed on the HIL 20. The HTL 30 may transmit holes received from the HIL 20 to the light-emitting layer 60. The HTL 30 may include a hole transport material having a hole mobility which is several times greater than the electron mobility of the material. For example, the HTL 30 may include starburst-aromatic-amine-based-materials, spiro-ladder type materials, 4,4'-bis[N-(1-naphthyl)-N-phenyl-amino]biphenyl (NPD), N,N'-bis-(3-methylphenyl)-N,N'-bis-(phenyl)-benzidine (TPD), N,N'-diphenyl-N,N'-bis(9-phenanthryl)benzidine (PPD), N,N-bis(phenanthren-9-yl)-N,N-diphenylbenzidine (TT-BND), N,N,N'N'-tetrakis(9,9-dimethylfluoren-2-yl)-[1,1'-biphenyl]-4,4'-diamine (FFD), N,N'-bis(4-(2-phenyl-2-(p-tolyl)ethenyl)-phenyl)-N-N'di(p-tolyl)-benzidine (p-dmDPS), or 4,4"-cyclohexylidene-bis[N,N-bis(4-methylphenyl)benzenamine] (TAPC), but is not limited thereto. The starburst aromatic amine group compounds may include 4,4'4"-tri(N-carbazolyl)-triphenylamine (TCTA), 4,4'4"-tris(diphenylamino)triphenylamine (PTDATA or TDATA), 4,4',4"-Tris(N-3-methylphenyl-N-phenyl-amino)-triphenylamine (MTDATA), 1,3,5-tris[4-(diphenylamino)benzene (TDAPB), 4-(3-(trifluoromethyl)-3H-diazirin-3-yl)benzoic acid (TDBA), or 4,4',4"-tri(N-phenothiazinyl)triphenylamine (TCTA). The spiro-ladder type material may include N,N'-bis(3-methylphenyl)-N,N'-bis(phenyl)-9,9-spirobifluorine (spiro-TPD), 2,2',7,7'-tetrakis[N,N-di(4-methoxyphenyl)amino]-9,9'-spirobifluorene (spiro-MeOTAD) or 2,2',7,7'-octa(m-tolylamine)-9,9'-spirobifluorine (spiro-mTTB). A combination comprising at least one of the foregoing may also be used.

The electron blocking layer 45 includes a plurality of layers and may be formed on the HTL 30. The electron blocking layer 45 may block excess electrons, which are transmitted from the second electrode layer 90 and that do not combine with holes in the light-emitting layer 60, from moving through the light-emitting layer 60 towards the first electrode layer 10. The electron blocking layer 45 may have a highest occupied molecular orbital (HOMO) value which is lower than the HOMO value of the HTL 30.

The electron blocking layer 45 may include a first electron blocking layer 40 and a second electron blocking layer 50. The first electron blocking layer 40 may be formed on the HTL 30, and the second electron blocking layer 50 may be formed on the first electron blocking layer 40. The second electron blocking layer 50 may have a HOMO value which is lower than the HOMO value of the first electron blocking layer 40. Also, the first electron blocking layer 40 and the second electron blocking layer 50 may have the same thickness. The electron blocking layer 45 may have a thickness in a range from about 25 Å to about 300 Å, or from about 50 Å to about 250 Å, or from about 75 Å to about 200 Å.

The electron blocking layer 45 may include at least one of tris(phenylpyrazole)iridium, 9,9-bis[4-(N,N-bis-biphenyl-4-ylamino)phenyl]-9H-fluorine (BPAPF), bis[4-(p,p-ditolylamino)phenyl]diphenylsilane (DTASI), 4,4'-bis[N-(1-naphthyl)-N-phenyl-amino]biphenyl (NPD), N,N'-dicarbazolyl-3,5-benzene (mCP), or bis[4-(N,N-diethylamino)-2-methylphenyl](4-methylphenyl)methane (MPMP), but is not limited thereto. A combination comprising at least one of the foregoing may also be used.

Also, the electron blocking layer 45 may include an inorganic compound. For example, the electron blocking layer 45 may include a halide compound or an oxide compound. The halide compound may include LiF, NaF, KF, RbF, CsF, FrF, $MgF_2$, $CaF_2$, $SrF_2$, $BaF_2$, LiCl, NaCl, KCl, RbCl, CsCl, or FrCl. The oxide compound may include $Li_2O$, $Li_2O_2$, $Na_2O$, $K_2O$, $Rb_2O$, $Rb_2O_2$, $Cs_2O$, $Cs_2O_2$, $LiAlO_2$, $LiBO_2$, $LiTaO_3$, $LiNbO_3$, $LiWO_4$, $Li_2CO$, $NaWO_4$, $KAlO_2$, $K_2SiO_3$, $B_2O_5$, $Al_2O_3$, or $SiO_2$. A combination comprising at least one of the foregoing may also be used.

The electron blocking layer 45 may act as a buffer layer to prevent the HTL 30 and the light-emitting layer 60 from directly contacting each other and to prevent electrons from moving into the HTL 30. That is, the electron blocking layer 45 may increase the efficiency and lifetime of the organic light-emitting device 100 by controlling the injection and movement of electrons and controlling the combination of holes with electrons.

The light-emitting layer 60 may be formed on the electron blocking layer 45. A wavelength of light emitted from the light-emitting layer 60 may vary according to the material included in the light-emitting layer 60. After forming excitons in the light-emitting layer 60, i.e., by combining holes transmitted from the first electrode layer 10 and electrons transmitted from the second electrode layer 90, light is emitted when an energy state of the excitons is reduced to a base state. Light emitted from the light-emitting layer 60 thus may vary according to a band gap of the material included in the light-emitting layer 60.

Also, the HOMO value of the light-emitting layer 60 may be lower than the HOMO value of the electron blocking layer 45. Accordingly, the organic light-emitting device 100 according to the current embodiment may have a cascade structure in which the HOMO values of the HTL 30, the electron blocking layer 45, and the light-emitting layer 60 are gradually lowered in succession.

The ETL 70 may be formed on the light-emitting layer 60. The ETL 70 may control a speed at which the electrons move so as to emit light by combining the holes and electrons in the light-emitting layer 60. The ETL 70 may include a material capable of moving electrons at a speed which is several times faster than other materials. The ETL 70 may include, for example, tris(8-hydroxyquinolino)aluminum (Alq3), 2-(4-biphenylyl)-5-(t-butylphenyl) 1,3,4-oxadiazole (PBD), 3-(Biphenyl-4-yl)-5-(4-tert-butylphenyl)-4- phenyl-4H-1,2,4-triazole (TAZ), spiro-PBD, bis(8-hydroxy-2-methylquinoline)-(4-phenylphenoxy)aluminum (BAlq), or aluminum (III)bis(2-methyl-8-quinolinato) triphenylsilanolate (SAlq), but is not limited thereto. A combination comprising at least one of the foregoing may also be used.

The EIL 80 may be formed on the ETL 70, and may transmit electrons received from the second electrode layer 90 to the ETL 70.

The second electrode layer 90 may be formed on the EIL 80. The second electrode layer 90 may be a cathode electrode, and may supply electrons to the light-emitting layer 60. The second electrode layer 90 applies the same voltage to all pixels, and thus, may be a type of common electrode. Accordingly, the second electrode layer 90 may be formed as a monolayer that is not patterned and which covers an entire surface of a substrate. Also, an auxiliary electrode may be connected to an upper or lower side of the second electrode layer 90, and thus, the resistance may be reduced.

In order to readily supply electrons to the light emitting layer 60, the second electrode 90 may include a material having high electrical conductivity and a high work function. The material having high electrical conductivity and high work function may include an alloy of Ag, Al, and Mo, or an alloy of Ag and Mg, but the current embodiment is not limited thereto. The material having a high work function may include a metal, such as Li, Na, or Ca. A combination comprising at least one of the foregoing may also be used.

The second electrode layer 90 may be formed using a vacuum evaporation method, an electron beam deposition method, or a sputtering deposition method. A combination comprising at least one of the foregoing may also be used. Also, in the case of a top emission type light-emitting device, light emitted from the light-emitting layer 60 transmits through the second electrode layer 90, and thus, the second electrode layer 90 may be formed to have a thickness of less than a few hundred angstroms.

Figure 2A:
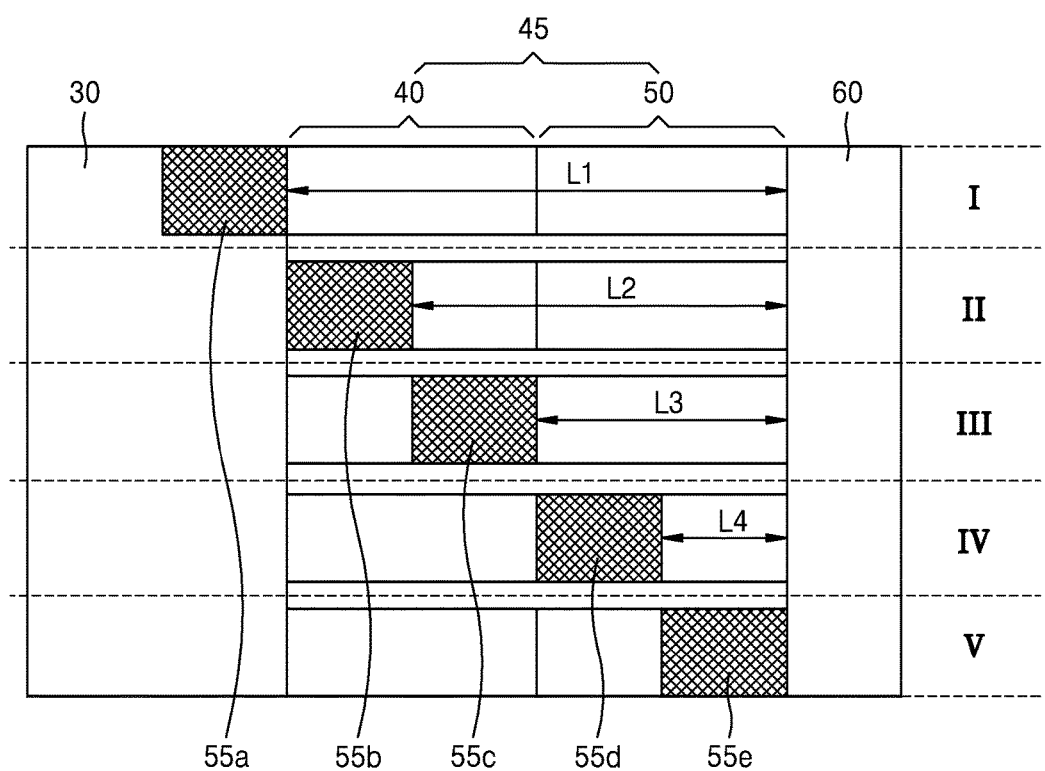
FIG. 2A is a cross-sectional view of an organic light-emitting device according to an embodiment, in which P-doped layers are inserted in locations which are different from each other.
Figure 2B:
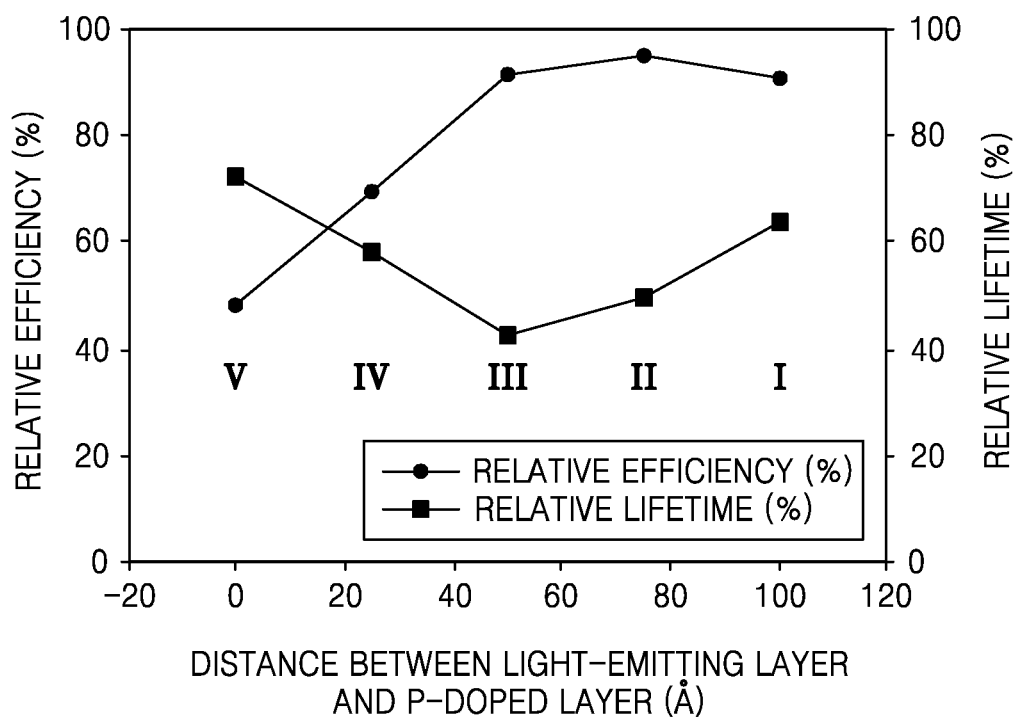
FIG. 2B is a graph of relative efficiency (percent, %) and relative lifetime (%) versus distance between the light-emitting layer and the p-doped layer (angstroms, Å), for the organic light-emitting device of FIG. 2A in which the P-doped layers are inserted in different locations.

FIG. 2A is a cross-sectional view of an organic light-emitting device according to an embodiment, in which P-doped layers 55a, 55b, 55c, 55d, and 55e are inserted in locations which are different from each other. FIG. 2B is a graph of relative efficiency and relative lifetime versus distance between the light-emitting layer and the p-doped layer of organic light-emitting devices which vary according to the location of the P-doped layers 55a, 55b, 55c, 55d, and 55e of FIG. 2A.

Referring to FIG. 2A, the electron blocking layer 45 may have a thickness in a range from about 25 Å to about 300 Å, or from about 50 Å to about 250 Å, or from about 75 Å to about 200 Å. The first electron blocking layer 40 may have the same thickness as the second electron blocking layer 50. The second electron blocking layer 50 may have a HOMO value which is lower than that the HOMO value of the first electron blocking layer 40.

The P-doped layers 55a, 55b, 55c, 55d, and 55e may have a thickness which is less than 25%, or less than 20%, or less than 15%, or less than 10%, or less than 5%, or less than 2% of the thickness of the electron blocking layer 45. For example, the P-doped layers 55a, 55b, 55c, 55d, and 55e may have a thickness in a range of from about 5 Å to about 75 Å, or from about 5 Å to about 50 Å, or from about 5 Å to about 35 Å. Also, the P-doped layers 55a, 55b, 55c, 55d, and 55e may perform a function of transporting holes and blocking electrons in a reverse bias state while the organic light-emitting device 100 is operated.

Referring to FIGS. 2A and 2B, in an Embodiment I, the P-doped layer 55a is inserted between the HTL 30 and the first electron blocking layer 40 of the organic light-emitting device 100. In the Embodiment I, the thickness of the electron blocking layer 45 may be approximately 100 Å, and the thicknesses of the first and second electron blocking layers 40 and 50, respectively, may be approximately 50 Å. Also, the thickness of the P-doped layer 55a may be approximately 25 Å. A distance L1 from a surface of the light-emitting layer 60 to a surface of the P-doped layer 55a facing the light-emitting layer 60 may be approximately 100 Å. At this point, the organic light-emitting device 100 according to the Embodiment I has a relative efficiency of 91% and a relative lifetime of 159% as compared to of the efficiency and lifetime of an organic light-emitting device in which the P-doped layers 55a, 55b, 55c, 55d, and 55e are not inserted.

In an Embodiment II, the P-doped layer 55b is inserted in the first electron blocking layer 40 and is adjacent to the HTL 30. In the Embodiment II, the thickness of the electron blocking layer 45 may be about 100 Å, and the thicknesses of the first and second electron blocking layers 40 and 50, respectively, may be about 50 Å. Also, the thickness of the P-doped layer 55b may be about 25 Å. A distance L2 from the light-emitting layer 60 to a surface of the P-doped layer 55a facing the light-emitting layer 60 may be about 75 Å. At this point, the organic light-emitting device 100 according to the Embodiment II shows a relative efficiency of 95% and a relative lifetime of 124% as compared to the efficiency and lifetime of an organic light-emitting device in which the P-doped layers 55a, 55b, 55c, 55d, and 55e are not inserted.

In an Embodiment III, the P-doped layer 55c is inserted in the first electron blocking layer 40 and is adjacent to the second electron blocking layer. In the Embodiment III, the thickness of the electron blocking layer 45 may be about 100 Å, and the thicknesses of the first and second electron blocking layers 40 and 50 respectively may be about 50 Å. Also, the thickness of the P-doped layer 55c may be about 25 Å. A distance L3 from the light-emitting layer 60 to a surface of the P-doped layer 55a facing the light-emitting layer 60 may be about 50 Å. At this point, the organic light-emitting device 100 according to the Embodiment III shows a relative efficiency of 92% and a relative lifetime of 107% as compared to the efficiency and lifetime of an organic light-emitting device in which the P-doped layers 55a, 55b, 55c, 55d, and 55e are not inserted.

In an Embodiment IV, the P-doped layer 55d is inserted in the second electron blocking layer 50 and is adjacent to the first electron blocking layer 40. In the Embodiment IV, the thickness of the electron blocking layer 45 may be about 100 Å, and the thicknesses of the first and second electron blocking layers 40 and 50 respectively may be about 50 Å. Also, the thickness of the P-doped layer 55d may be about 25 Å. A distance L4 from the light-emitting layer 60 to a surface of the P-doped layer 55d facing the light-emitting layer 60 may be about 50 Å. At this point, the organic light-emitting device 100 according to the Embodiment IV shows a relative efficiency of 70% and a relative lifetime of 146% as compared to the efficiency and lifetime of an organic light-emitting device in which the P-doped layers 55a, 55b, 55c, 55d, and 55e are not inserted.

In an Embodiment V, the P-doped layer 55e is inserted in the second electron blocking layer 50 and is adjacent to the light-emitting layer 60. In the Embodiment V, the thickness of the electron blocking layer 45 may be about 100 Å, and the thicknesses of the first and second electron blocking layers 40 and 50 respectively may be about 50 Å.

Also, the thickness of the P-doped layer 55e may be about 25 Å. The light-emitting layer 60 and the P-doped layer 55e may contact each other. At this point, the organic light-emitting device 100 according to the Embodiment V shows a relative efficiency of 49% and a relative lifetime of 182% as compared to the efficiency and lifetime of an organic light-emitting device in which the P-doped layers 55a, 55b, 55c, 55d, and 55e are not inserted.

In the above Embodiments I, II, III, IV, and V, after inserting the P-doped layer 55a between the HTL 30 and the electron blocking layer 45 and inserting the P-doped layers 55b, 55c, 55d, and 55e in either the first electron blocking layer 40 or the second electron blocking layer 50 of the electron blocking layer 45, the relative efficiency and the relative lifetime of the organic light-emitting device 100 as a function of the distance between the light-emitting layer 60 and the P-doped layers 55a, 55b, 55c, 55d, and 55e, are measured. Without being limited by theory, it is believed that when the distance between a P-doped layer and the light-emitting layer 60 is small, a large efficiency reduction may occur due to quenching of excitons. As the distance between the light-emitting layer 60 and the P-doped layer increases, the efficiency of the organic light-emitting device 100 is increased and the lifetime is reduced. However, when the distance between the P-doped layer and the light-emitting layer 60 increases beyond a certain level, the lifetime of the organic light-emitting device 100 is increased while the efficiency is maintained. Accordingly, an optimum distance between the light-emitting layer 60 and the P-doped layer, at which the efficiency and the lifetime of the organic light-emitting device 100 are maximized, may be determined by minimizing the reduction in efficiency due to the quenching of excitons by reducing the number of excess electrons in the light-emitting layer. The organic light-emitting device 100 according to the current embodiment may optimize the efficiency and the lifetime of the organic light-emitting device 100 by changing the location in which the P-doped layer is inserted, i.e., in the electron blocking layer 45 or the HTL 30.

Figure 3A:
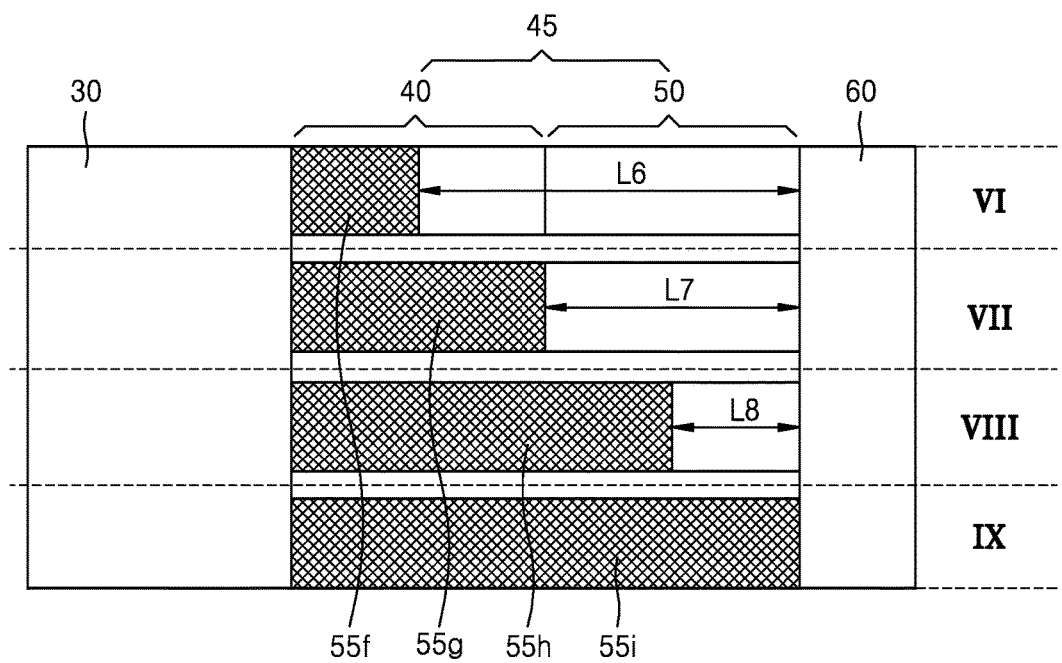
FIG. 3A is a cross-sectional view of an organic light-emitting device according to an embodiment, in which P-doped layers having thicknesses which are different from each other are inserted.
Figure 3B:
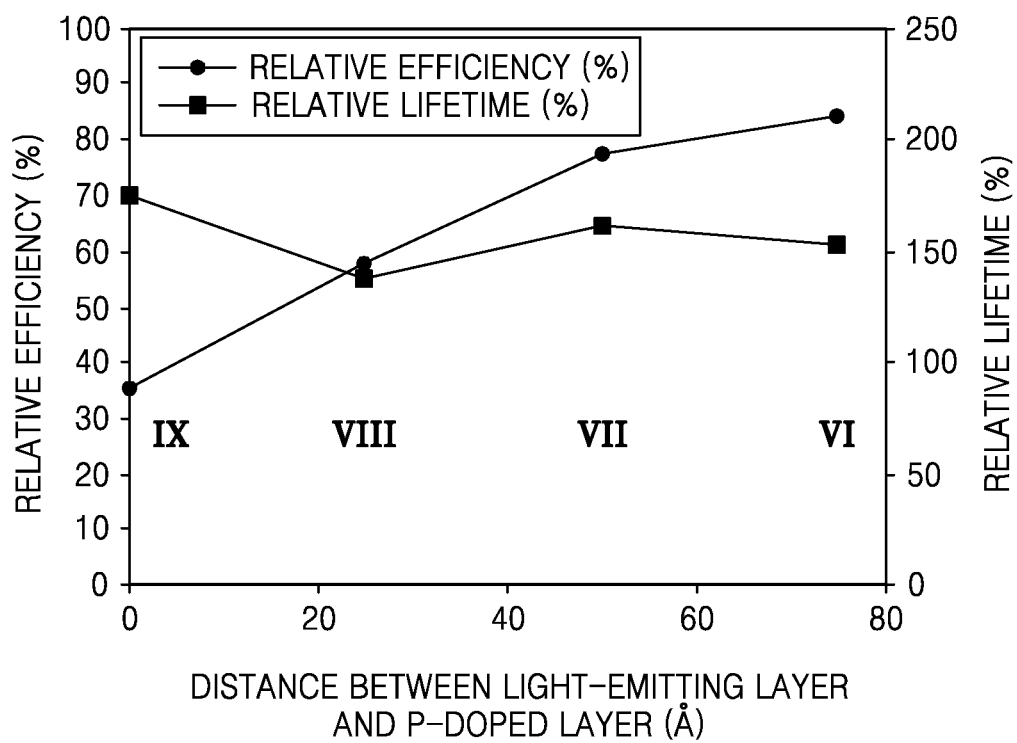
FIG. 3B is a graph of relative efficiency (%) and relative lifetime (%) versus distance between the light-emitting layer and the p-doped layer (Å), of the organic light-emitting device of FIG. 3A.

FIG. 3A is a cross-sectional view of the organic light-emitting device 100 according to an embodiment, in which P-doped layers 55f, 55g, 55h, and 55i having different thicknesses are inserted in the electron blocking layer 45, and FIG. 3B is a graph of relative efficiency and relative lifetime versus distance between the light-emitting layer and the p-doped layer of organic light-emitting devices 100 which vary according to the thickness of the P-doped layers 55f, 55g, 55h, and 55i of FIG. 3A. As illustrated in FIG. 3A, the "thickness" of the layer is shown as a width of the layer.

Referring to FIG. 3A, the thickness of the electron blocking layer 45 may be greater than about 25 Å and less than about 300 Å, or from about 50 Å to about 250 Å, or from about 75 Å to about 200 Å. The thickness of the first electron blocking layer 40 may be the same as the thickness of the second electron blocking layer 50. Also, the HOMO value of the second electron blocking layer 50 may be lower than the HOMO value of the first electron blocking layer 40.

The thicknesses of the P-doped layers 55f, 55g, 55h, and 55i may be greater than 25%, or greater than 50%, or greater than 75% of the thickness of the electron blocking layer 45 and less than thickness of the electron blocking layer 45. For example, the thicknesses of the P-doped layers 55f, 55g, 55h, and 55i may be greater than about 5 Å, or greater than about 12.5 Å, or greater than about 18.8 Å and less than about 300 Å, or less than about 250 Å, or less than about 200 Å. The P-doped layers 55f, 55g, 55h, and 55i may provide a function of transporting holes and blocking electrons in a reverse bias state while the organic light-emitting device 100 is operated.

Referring to FIGS. 3A and 3B, in an Embodiment VI, the P-doped layer 55f is inserted in the first electron blocking layer 40 of the organic light-emitting device 100 and the P-doped layer 55f may contact the HTL 30. In the Embodiment VI, the thickness of the electron blocking layer 45 may be about 100 Å, and the thicknesses of the first and second electron blocking layers 40 and 50, respectively, may be about 50 Å. The thickness of the P-doped layer 55f may be about 25 Å. A distance L6 from a surface of the light-emitting layer 60 to a surface of the P-doped layer 55a facing the light-emitting layer 60 may be about 75 Å. At this point, the organic light-emitting device 100 according to the Embodiment VI shows a relative efficiency of 84% and a relative lifetime of 153% as compared to the efficiency and lifetime of an organic light-emitting device in which the P-doped layers 55f, 55g, 55h, and 55i are not inserted.

In an Embodiment VII, the P-doped layer 55g is inserted in the first electron blocking layer 40 and the P-doped layer 55g may contact the HTL 30. In the Embodiment VII, the thickness of the electron blocking layer 45 may be about 100 Å, and the thicknesses of the first and second electron blocking layers 40 and 50 respectively may be about 50 Å. The thickness of the P-doped layer 55g may be about 50 Å. A distance L7 from the light-emitting layer 60 to a surface of the P-doped layer 55g facing the light-emitting layer 60 may be about 50 Å. At this point, the organic light-emitting device 100 according to the Embodiment VI shows a relative efficiency of 78% and a relative lifetime of 162% as compared to the efficiency and lifetime of an organic light-emitting device in which the P-doped layers 55f, 55g, 55h, and 55i are not inserted.

In an Embodiment VIII, the P-doped layer 55h is inserted in the first electron blocking layer 40 and crosses over into a portion of the second electron blocking layer 50. In Embodiment VIII, the P-doped layer 55h may contact the HTL 30. In the Embodiment VIII, the thickness of the electron blocking layer 45 may be about 100 Å, and the thicknesses of the first and second electron blocking layers 40 and 50 respectively each may be about 50 Å. Also, the thickness of the P-doped layer 55h may be about 75 Å. A distance L8 from the light-emitting layer 60 to a surface of the P-doped layer 55h facing the light-emitting layer 60 may be about 25 Å. At this point, the organic light-emitting device 100 according to the Embodiment VIII shows a relative efficiency of 58% and a relative lifetime of 139% as compared to the efficiency and lifetime of an organic light-emitting device in which the P-doped layers 55f, 55g, 55h, and 55i are not inserted.

In an Embodiment IX, the P-doped layer 55i is inserted in the first and second electron blocking layers 40 and 50. In the Embodiment Xi, the thickness of the electron blocking layer 45 may be about 100 Å, and the thicknesses of the first and second electron blocking layers 40 and 50 respectively may be about 50 Å. Also, the thickness of the P-doped layer 55i may be about 100 Å. The P-doped layer 55i may simultaneously contact the HTL 30 and the light-emitting layer 60. At this point, the organic light-emitting device 100 according to the Embodiment IX shows a relative efficiency of 35% and a relative lifetime of 175% as compared to the efficiency and lifetime of an organic light-emitting device in which the P-doped layers 55f, 55g, 55h, and 55i are not inserted.

In the above Embodiments VI, VII, VIII, and IX, the relative efficiency and the relative lifetime of the organic light-emitting device 100 are measured by changing the thickness of the P-doped layers 55f, 55g, 55h, and 55i, and inserting the P-doped layers in the electron blocking layer 45 so as to be in contact the HTL 30. Also, in this case, a thickness of the P-doped layer may be determined to maximize the efficiency and lifetime of the organic light-emitting device 100 by reducing the number of excess electrons in the light-emitting layer 60 and thereby minimizing the reduction in efficiency which is due to the quenching of excitons. The organic light-emitting device 100 according to the current embodiment may optimize the efficiency and the lifetime of the organic light-emitting device 100 by changing the thickness of the P-doped layer inserted in the electron blocking layer 45.

The organic light-emitting device according to the current embodiment has a structure in which the HOMO values of an HTL, an electron blocking layer, and a light-emitting layer are gradually lowered in succession, and thus, the lifetime of the organic light-emitting device may be increased.

Also, the organic light-emitting device according to the current embodiment may determine an optimum point of efficiency and lifetime by inserting a P-doped layer in a multi-layered electron blocking layer and by varying the location of the P-doped layer in the organic light-emitting device.

The embodiments are examples, and thus, it will be understood by those of ordinary skill in the art that various changes in form and details may be made therein without departing from the spirit and scope of the invention. Therefore, the embodiments should be considered in descriptive sense only and not for purposes of limitation. For example, each constituent element that is described as a singular form may be embodied in distribution forms. Also, constituent elements that are described in distribution forms may be embodied in a combined form.

Therefore, the scopes of the embodiments are defined not by the detailed description but by the appended claims, and all differences within the scope will be construed as being included in the embodiments.

What is claimed is:

1. An organic light-emitting device comprising:
   a first electrode layer;
   a hole injection layer on the first electrode layer;
   a hole transport layer on the hole injection layer;
   an electron blocking layer on the hole transport layer, and comprising a plurality of layers;
   a light-emitting layer on the electron blocking layer;
   an electron transport layer on the light-emitting layer;
   an electron injection layer on the electron transport layer; and
   a second electrode layer on the electron transport layer
   wherein the electron blocking layer has a highest occupied molecular orbital value which is lower than a highest occupied molecular orbital of the hole transport layer, and the light-emitting layer has a highest occupied molecular orbital value which is lower than a highest occupied molecular orbital value of the electron blocking layer, and
   the highest occupied molecular orbital values of the hole transport layer, the electron blocking layer, and the light-emitting layer decrease according to the order of the layers.

2. The organic light-emitting device of claim 1, wherein the electron blocking layer comprising the plurality of layers comprises:
   a first electron blocking layer on the hole transport layer; and
   a second electron blocking layer on the first electron blocking layer,
   wherein the second electron blocking layer has a highest occupied molecular orbital value lower than a highest occupied molecular orbital of the first electron blocking layer.

3. The organic light-emitting device of claim 2, further comprising a P-doped layer between the hole transport layer and the first electron blocking layer.

4. The organic light-emitting device of claim 3, wherein the electron blocking layer has a thickness in a range from about 25 angstroms to about 300 angstroms.

5. The organic light-emitting device of claim 3, wherein the P-doped layer has a thickness which is less than 25% of a thickness of the electron blocking layer.

6. The organic light-emitting device of claim 3, wherein the P-doped layer has a thickness in a range from about 5 angstroms to about 75 angstroms.

7. The organic light-emitting device of claim 2, further comprising a P-doped layer inserted in the electron blocking layer.

8. The organic light-emitting device of claim 7, wherein the electron blocking layer has a thickness in a range from about 25 angstroms to about 300 angstroms.

9. The organic light-emitting device of claim 7, wherein the P-doped layer has a thickness which is less than 25% of a thickness of the electron blocking layer.

10. The organic light-emitting device of claim 7, wherein the P-doped layer has a thickness which is greater than 25% of a thickness of the electron blocking layer and less than 100% of the thickness of the electron blocking layer.

11. The organic light-emitting device of claim 7, wherein the P-doped layer has a thickness in a range from about 5 angstroms to about 75 angstroms.

12. The organic light-emitting device of claim 7, wherein the P-doped layer comprises a first surface on a side of the light-emitting layer and a second surface on a side of the hole transport layer, wherein a distance from the light-emitting layer to the first surface of the P-doped layer is smaller than a thickness of the electron blocking layer.

13. The organic light-emitting device of claim 12, wherein the P-doped layer is in contact with the light-emitting layer.

14. The organic light-emitting device of claim 12, wherein the P-doped layer is in contact with the hole transport layer.

15. An organic light-emitting device comprising:
   a first electrode layer;
   a hole injection layer on the first electrode layer;
   a hole transport layer on the hole injection layer;
   a multilayer electron blocking layer on the hole transport layer;
   a light-emitting layer on the electron blocking layer;
   an electron transport layer on the light-emitting layer;
   an electron injection layer on the electron transport layer; and
   a second electrode layer on the electron transport layer,
   wherein the multilayer electron blocking layer comprises a first electron blocking layer, a second electron blocking layer, and a P-doped layer, wherein the P-doped layer is inserted in the first electron blocking layer, the second electron blocking layer, or in a combination of the first electron blocking layer and the second electron blocking layer, and
   the highest occupied molecular orbital values of the hole transport layer, the electron blocking layer, and the light-emitting layer decrease according to the order of the layers.

16. The organic light-emitting device of claim 15, wherein the P-doped layer is in contact with the hole transport layer.

17. The organic light-emitting device of claim 15, wherein the P-doped layer is in contact with the hole transport layer and the light-emitting layer.

\* \* \* \* \*